United States Patent [19]

Ziemer et al.

[11] Patent Number: 5,049,332
[45] Date of Patent: Sep. 17, 1991

[54] METHOD OF MAKING CONDUCTIVE METAL-FILLED SUBSTRATES WITHOUT DEVELOPING AGENTS

[75] Inventors: Karolyn E. Ziemer, Crystal Lake; William J. E. Parr, Naperville, both of Ill.

[73] Assignee: Akzo nv, Arnhem, Netherlands

[21] Appl. No.: 547,668

[22] Filed: Jul. 3, 1990

Related U.S. Application Data

[63] Continuation-in-part of Ser. No. 204,069, Jun. 8, 1988, abandoned.

[51] Int. Cl.$^5$ .............................................. B29C 43/02
[52] U.S. Cl. .................................. 264/104; 252/519; 264/122; 264/126; 264/320; 264/DIG. 25; 264/325; 419/22; 419/32
[58] Field of Search ............... 264/104, 108, 109, 118, 264/122, 24, 105, 61, 123, 125, 126, 320, DIG. 25, 325; 252/511, 512, 518, 519; 419/32, 34, 65, 19, 22; 428/901; 425/78, DIG. 122, DIG. 133

[56] References Cited

U.S. PATENT DOCUMENTS

| | | | |
|---|---|---|---|
| 3,538,023 | 11/1970 | Bowman | 252/518 |
| 3,708,387 | 1/1973 | Turner et al. | 264/122 |
| 3,910,852 | 10/1975 | Lederman et al. | 252/518 |
| 4,282,117 | 8/1981 | Muramoto et al. | 252/518 |
| 4,325,734 | 4/1982 | Burrage et al. | 425/78 |
| 4,590,115 | 5/1986 | Cassat | 428/174 |
| 4,778,636 | 10/1988 | Krieg et al. | 264/104 |
| 4,931,365 | 6/1990 | Inoue et al. | 428/901 |
| 4,963,291 | 10/1990 | Bercaw | 252/518 |

*Primary Examiner*—Jeffery Thurlow
*Assistant Examiner*—Mathieu Vargot
*Attorney, Agent, or Firm*—Louis A. Morris

[57] ABSTRACT

A conductive-metal-filled substrate is formed by intermingling oxide coated, non-conductive copper or nickel particles into a substrate having a softening point of at least 200° C. followed by compression molding at a temperature of at least 200° C. The filled substrates are electrically conductive and are useful for a variety of uses such as EMI shielding.

6 Claims, No Drawings

METHOD OF MAKING CONDUCTIVE METAL-FILLED SUBSTRATES WITHOUT DEVELOPING AGENTS

CROSS REFERENCE TO RELATED APPLICATION

This application is a continuation-in-part of my prior copending application Ser. No. 204,069, filed June 8, 1988, now abandoned, incorporated herein by reference.

BACKGROUND OF THE INVENTION

This invention relates to the formation of substrates which contain a filler such that the filled substrate is rendered electrically conductive. In particular, this invention relates to such a process wherein the conductive filler is formed from discrete metal particles of copper or nickel.

It is frequently desired to incorporate a conductive metal filler in a (generally) non-conductive substrate. Such composites are useful for electromagnetic interference (EMI) shielding and so forth.

There is art that deals with the problem of forming a layer of conductive metal on the surface of a substrate. In contrast, the instant invention deals with the problem of rendering an entire three-dimensional substrate conductive.

U.S. Pat. No. 4,778,636 to Krieg et al. discloses a method of making plastic, electrically conductive plates by mixing an electrically conducting substance, such as carbon black or aluminum flake, with thermoplastic particles and pressure forming the mixture produced from the mixing step. Krieg et al. teaches the necessity of extreme high energy mixing of the plastic and conducting substance, i.e. by a "Retsch" centrifugal force ball mill. Thus, in Krieg et al. Example 10, where such mixing is employed, the use of aluminum flake in polycarbonate is successful, while in Example 11, where a simple vane stirrer is employed with the same ingredients, poor conductivity is obtained. It is also interesting to note the skin that develops on the Krieg et al. pressure-formed plates which must be removed by grinding or facing.

U.S. Pat. No. 3,708,387 to Turner et al. also discloses incorporating a conductive material, such as copper or nickel, in a plastic matrix. The reference warns that the metals should be used in as pure a form as possible and be free of surface oxidation. Turner et al. shows in its examples failure to obtain a conductive material due to an oxidized surface on the aluminum.

The present invention, in marked contradistinction to the above teachings, is able to make conductive a non-conductive powder blend of substrate and oxide coated metal particles without resorting to extreme means of mixing, such as with use of a ball mill.

SUMMARY OF THE INVENTION

A conductive copper or nickel metal-filled substrate in which the copper or nickel is the sole source of conductivity, comprising:

a. an intermingling step of powder blending substantially non-conductive oxide coated copper or nickel metal particles having a number average particle size less than 50 microns in a finely-divided powdered substrate material having a softening point of at least about 200° C. and selected from the group consisting of polyetheretherketones (PEEK), polyetherketones (PEK), polyarylates, polysulfones, polyarylsulfone, liquid crystalline polymers, and thermoplastic polyimide resins; and b. a molding step of subjecting the blended metal particles and the substrate first to an effective pressure and then raising the blend to a temperature above the flow temperature of the substrate.

The method of the invention is convenient to carry out, involves relatively non-corrosive materials, and produces coherent, very conductive metal-filled substrates, at surprisingly low weight percent content of metal.

DETAILED DESCRIPTION OF THE INVENTION

One element of the invention is the use of nickel or copper particles. In general, any nickel or copper which is in the form of a powder is suitable for use in the invention. Of some importance is the particle size of the nickel or copper. The principal difficulty with large particle sizes is that of obtaining a uniform distribution of particles in the substrate and ensuring adequate particle-to-particle contact in the three dimensions of the substrate. Generally, the number average particle size will be below 50, preferably below 30, and more preferably below 10 $\mu$m.

Although it would be obvious in view of the above discussed prior art to use pure copper or nickel to make a conductive metal-filled substrate, the present invention is based on the discovery that non-conductive, oxide coated copper or nickel will function perfectly when the metal-filled substrate is made by the instant method. Furthermore, the only source of conductivity of the conductive metal-filled substrate is the copper or nickel particles. The presence of other conductive fillers, such as carbon black, is precluded.

The metal particles are distributed in a substrate in a concentration of from about 7 wt % to about 25 wt % of the mixture, preferably from about 10 wt % to about 20 wt %. Suitable substrates are those capable of temporarily being, upon the application of heat at a temperature of more than 200° C., in a relatively soft, deformable state so as to be able to be molded, and upon cooling, is capable of being in a relatively hard, non-deformable state so as to be able to provide a relatively undisturbed distribution of the metal after the metal has become intermingled. Thus, materials such as thermoplastic resins are suitable.

Suitable thermoplastic resins include polyetheretherketones (PEEK), polyetherketones (PEK), polyarylates, polysulfones, polyarylsulfones, liquid crystalline polymers, and thermoplastic polyimide resins. It may be noted that a common feature of such resins is a high degree of aromatic linking units. The presence of such structure commonly produces polymers which have high glass transition temperatures and flow temperatures above 200° C. In general, it is desirable to have, in the repeating units of the polymer, at least 40%, desirably at least 50%, and more desirably at least 60% of the carbon atoms being aromatic carbon atoms.

The substrates may be selected from the usual commercial grades of available materials, and no special handling or treatment is required. The substrate also may contain fillers such as minerals, glass fibers, etc.

It is specifically not a requirement of the invention that the metal particles are contacted with a developing agent.

The metal particles are intermingled with the substrate by mere powder blending. The use of melt blending is specifically not suitable and does not produce a conductive substrate in the absence of developing agents. Powder blending may be accomplished by first grinding or the use of other means (e.g., crystallization) to put the substrate in a very finely divided state (i.e., a powder), and thereafter simply mechanically mixing the metal and substrate. While the fineness of the powder is not critical, in general finer powders will allow for more uniform blending of the substrate and the metal. In general, the substrate should be sufficiently fine that at least 50% will pass through a 4 mm, desirably a 2 mm, preferably a 1 mm, and more preferably an 850 mm sieve. The powder blending employed by the present invention is characterized by low shear and low intensity which does not rise to the level of abrading or removing the oxide coating of the metal particles.

It is necessary to form the powder-blending mixture of the substrate and metal by compression molding at a temperature above the flow temperature of the substrate, which for the substrates contemplated by the invention would be above 200° C. The blended metal particles and substrate are pressurized in the molding step prior to the flow temperature being reached. The compression molding cycle results in the metal becoming conductive. The precise pressure used in the molding is not critical, and will vary somewhat depending on the substrate chosen. What is important is that the pressure be sufficient that the resin is formed to the shape of the mold and that the metal is rendered conductive. In general, a pressure at least 3, preferably at least 5, and more preferably at least 10 MPA will be used. The precise temperature is also not critical, so long as it is at least about 200° C. and is above the flow temperature of the resin. Generally, a temperature of 200° to 400° C. and preferably 220° to 350° C., and more preferably 240° to 280° C. will be suitable. The exclusion of oxygen is believed to be important to the development of the metal to a conductive state However, in a typical closed mold used for compression molding, no special steps are needed to exclude oxygen.

Although not wishing to be limited to any particular hypothesis, it is believed that for the particular polymer and metal oxide coated powder blends employed by the instant invention, the polymer particles when pressured with the oxided metal particles below the flow temperature of the polymer will abrade, remove or in some way disrupt the oxide coating, thus rendering the metal particles conductive. It is therefore important that a powder blend be made rather than a melt blend so that the hard polymer particles are forced against the metal oxide coating when the blend is pressurized. Compounding the blend by use of an extruder would also be ineffective.

Conductive substrates of the invention are useful in a wide variety of applications including EMI shielding, battery plates, electrical switches, and decorative panels.

The following examples are set forth to further explain the invention.

EXAMPLE 1

Polyethersulfone (ICI, Victrex 4100P) powder was hand blended with various amounts of copper powder (Poudmet 22BB400) or nickel powder (Alcan 756). The powder mixtures were then subjected to compression molding at the temperature and for the time shown below in a closed cavity mold of 6"×6"×0.125× (152×152×3.17 mm). Initial pressure was 1 tpsi (13.8 MPa), thereafter 12 tpsi (165 MPa). After cooling the samples were removed, cut, and assessed for volume resistivity and EMI shielding effectiveness.

| Metal | Wt % Metal | Molding Temp (°C.) | Time (m) | Volume Resistivity ohm cm | EMI Shielding (dB) at | | | |
|---|---|---|---|---|---|---|---|---|
| | | | | | 30 | 100 | 300 | 1000 MHz |
| Cu | 20 | 225 | 55 | 0.08 | 61 | 67 | 80 | 90 |
| Cu | 15 | 255 | 55 | 0.15 | 61 | 47 | 54 | 77 |
| Cu | 15 | 265 | 20 | 0.14 | 66 | 46 | 58 | 86 |
| Cu | 15 | 265 | 15 | 0.16 | 61 | 49 | 58 | 73 |
| Cu | 15 | 265 | 10 | 0.14 | 58 | 43 | 54 | 66 |
| Cu | 10 | 255 | 55 | 0.28 | 61 | 42 | 56 | 72 |
| Ni | 20 | 255 | 55 | 0.18 | 61 | 57 | 70 | 83 |
| Ni | 15 | 255 | 55 | 0.21 | 61 | 51 | 65 | 90 |
| Ni | 10 | 255 | 55 | 3.7 | 31 | 25 | 39 | 22 |
| Ni | 20 | 265 | 30 | 0.23 | 61 | 53 | 67 | 80 |
| Ni | 20 | 265 | 15 | 0.28 | 60 | 51 | 65 | 74 |
| Ni | 20 | 265 | 10 | 0.24 | 58 | 45 | 59 | 61 |
| Ni | 20 | 265 | 5 | 0.29 | 57 | 46 | 59 | 60 |

From the results it can be seen that highly conductive PES samples, with high shielding capability, can be obtained from a simple blend of polymer and metal. The metal loadings required in this procedure are lower than required when the metal is compounded into the molten resin (e.g., by extrusion). It is remarkable that only 10-20% by weight of metal is sufficient to give highly conductive composites—this is a positive advantage since increasing loadings of fillers will generally be accompanied by corresponding reductions in the physical properties of the composite. It will be noted that the above results are achieved without the addition of a developing agent.

EXAMPLE 2

Polysulfone resin (Amoco, Udel 1700) was ground to a powder which would pass through an 18 mesh (1.00 mm) sieve. The powdered polymer was hand blended with copper (Poudmet 22BB400) or nickel (Alcan 756) powder. The powder was then subjected to compression molding in a closed mold for 30 minutes at 265° C. The polymer samples obtained were assessed for volume resistivity and the results obtained are shown below:

| Metal | Wt % Metal | Volume Resistivity ohm cm |
|---|---|---|
| Cu | 20 | 1180 |

-continued

| Metal | Wt %<br>Metal | Volume Resistivity<br>ohm cm |
|---|---|---|
| Cu | 30 | 0.128 |
| Ni | 20 | greater than $10^{13}$ |
| Ni | 30 | 954 |

EXAMPLE 3

Polyetheretherketone (ICI, Victrex 150 P) powder was hand blended with copper or nickel powder and the blends compression molded in a closed mold for 20 minutes at 350° C. After molding samples were assessed for volume resistivity.

| Metal | Wt %<br>Metal | Volume<br>Resistivity<br>ohm cm | EMI Attenuation (dB) at | | | |
|---|---|---|---|---|---|---|
| | | | 30 | 100 | 300 | 1000 MHZ |
| Cu | 20 | 0.16 | 61 | 50 | 64 | 74 |
| Cu | 10 | 0.22 | 55 | 40 | 52 | 59 |
| Ni | 20 | 0.78 | 53 | 39 | 55 | 50 |
| Ni | 10 | $10^{15}$ | 6 | 3 | 17 | 5 |

Note that excellent attenuation are possible by the procedure described, at low weight (10%, 20%) loadings of metal.

EXAMPLE 4

Polyethersulfone powder (Victrex 4100G, ICI) was blended with 20% by weight of copper powder (Poudmet 22BB400) or nickel powder (Alcan 756). The powder mixtures were compression molded as described in Example 1 to afford 1/6" (1.59 mm) thick sheets. From the resulting samples, tensile dogbone specimens were cut. The tensile strength of these specimens were measured on an Instron tester; the surface resistivity of the samples were also recorded. The specimens were placed in a circulating air oven at 90°C. and samples withdrawn for tensile and conductivity measurements at intervals. Results are shown in the Table below:

| Metal | Time at<br>90° C. (weeks) | Tensile Strength | | Surface Resistivity<br>(ohm/sq) |
|---|---|---|---|---|
| | | (psi) | (MPa) | |
| Cu | 0 | 7129 | (49.15) | 1.7–2.0 |
| Cu | 1 | 8187 | (56.45) | 1.8 |
| Cu | 2 | 8567 | (59.07) | 1.9–2.0 |
| Cu | 3 | 8454 | (58.29) | 1.6–2.0 |
| Cu | 4 | 8536 | (58.85) | 1.7–2.0 |
| Ni | 0 | 7942 | (54.76) | 5.7–10.0 |
| Ni | 1 | 7332 | (50.55) | 9.5–85.0 |
| Ni | 2 | 8155 | (56.23) | 12.0–50.0 |
| Ni | 3 | 7883 | (54.35) | 7.0–60.0 |
| Ni | 4 | 7826 | (53.96) | 4.0–60.0 |

From the results it can be seen that, within experimental error, neither copper or nickel fillers result in a loss of tensile strength upon oven aging when added to polyethersulfone. Similarly there is little loss in surface conductivity for nickel or copper filled formulations.

EXAMPLE 5

A 0.125" (3.17 mm) thick sample of polyethersulfone containing 20% by weight of copper powder was prepared as described in Example 1 (molded at 265° C. for 50 minutes) and possessed a volume resistivity of 0.08 ohm cm. This sample was made the cathode of an electrolytic cell; the anode was made of copper. Both electrodes were immersed in a solution containing 200 g/l of cupric sulfate and 50 g/l of sulfuric acid. A current of 1 A was passed for 1 hour. At the end of this time a 0.0015" (0.038 mm) thick layer of (pink) copper had become deposited upon the copper filled polyethersulfone. This deposit was not peeled away when subjected to a "Scotch tape test".

Comparative Example A

Copper powder (Poudmet 22BB400) was compounded into polyethersulfone (Victrex 4100P, ICI) at a loading of 35% by weight. A Haake twin-screw extruder was used with barrel/die temperatures of 315°–345° C. The resulting extrudate was pelletized and dried. The pellets were used to compression mold 6"×6"×0.125" (152×152×3.17 mm) plaques in a closed cavity mold. The molding cycle was 270° C. for 15 minutes with initial pressure being 1 ton/square inch (13.8 MPa) and final pressure being 12 tons/square inch (165 MPa). The sample obtained from compression molding exhibited greater than 10 ohm/square surface resistivity, was orange in color, and had a volume resistivity of greater than $10^{10}$ ohm·cm.

Comparative Example B

Polyethersulfone samples containing 35% by weight of nickel powder (Alcan 756) were prepared as described in Comparative Example A. The samples obtained after compression molding had a surface resistivity above $10^7$ ohms/square and a volume resistivity of greater than $10^{10}$ ohm·cm.

The above data demonstrates that when extrusion (i.e. a melt-blending process) is employed to produce a copper or nickel filled polyethersulfone composite, that composite exhibits high resistivity (and therefore low EMI attenuation), even when the metal content is much greater than that which affords excellent conductivity/EMI attenuation when powder blends are simply compression molded.

EXAMPLE 6

This example was conducted to verify that in fact all metal powders used in the formulation of the conductive metal-filled substrates of the above examples, including Poudmet 22BB400 and Alcan 756, were non-conductive due to the oxide coatings they naturally acquired due to exposure to air. The resistivity of these powders was measured when coated onto a substrate in accordance with the following method.

Approximately 10 g of the metal powder were mixed with 12 mls of 1,2-dichloroethane to afford a thin slurry. This slurry was spread onto a 5 mil thick, 5"×4" sheet of polyetherimide uniformly using a wire wound drawdown bar. The solvent was allowed to evaporate leaving a thin uniform coating of the metal on the surface of the plastic film. (Note—no binder resin was employed, the solvent used modestly attacked the plastic to allow sufficient adhesion of the metal to the polymer to permit handling). The surface resistance was measured using a 4-probe ohmmeter connected to four brass pads (each of approximately 5.5 cm² area) placed onto the metal surface.

On no occasion was the resistivity of these powders when coated onto the substrate, less than 1 kilo ohm/square, and was typically greater than 100 kilo ohm/square. The units of ohms/square are in common usage as a measure of surface resistance in the literature (e.g. U.S. Pat. No. 4,382,981) and can be described as the surface resistance measured between contact pads, each of area ×cm² separated from each other by a distance of

EXAMPLE 7

To provide a further comparison with Krieg et al., which specifies (col 7, lines 28-31) that the materials to be used as the electrically conducting substance have a conductivity of $>10^3 (\text{ohm}\cdot\text{cm})^{-1}$, the surface and bulk conductivity of Poudmet 22BB400 copper was measured as received (i.e. in the state used for the instant examples), and after hydrogen reduction to remove the oxide layer from the surface of the copper. Surface resistance was measured in ohms/square in the fashion described above and was $>10^6$ ohm/square before oxide removal and 0.6 ohm/square after reduction of the oxide layer from the copper particles. Bulk resistivity of the dry powders was measured in ohms by compacting the powder into a cavity of known volume (by tapping) and measuring the resistance from one side of the cavity to the other; before oxide removal the bulk resistance of the copper powder was quoted as $3 \times 10^4$ ohms, while after hydrogen reduction of the oxide layer the bulk resistance was 0.3 ohm. By considering the cross sectional area of the cavity and its length then it is possible to convert these measurements to approximately $6 \times 10^4$ ohm·cm and 0.6 ohm·cm resistivities respectively. Both the surface and bulk resistance data confirm that the Poudmet 22BB400 copper powder, as used in the instant examples, is covered with a layer of oxide which prevents good electrical conductivity, and furthermore that the conductivity of the Poudmet 22BB400 is well above the maximum value of 1000 ohm·cm specified by Krieg et al. at col. 7, lines 28-31. Krieg et al.'s teaching would therefore imply that the Poudmet copper powder would not be useful in his invention and therefore the success achieved with it in the method is indeed surprising.

We claim:

1. A method of forming a conductive copper or nickel metal-filled substrate in which the copper or nickel is the sole source of conductivity, comprising:
   a. an intermingling step of powder blending substantially non-conductive oxide coated copper or nickel metal particles having a number average particle size less than 50 microns in a finely-divided powdered substrate material having a softening point of at least about 200° C. and selected from the group consisting of polyetheretherketones (PEEK), polyetherketones (PEK), polyarylates, polysulfones, polyarylsulfone, liquid crystalline polymers, and thermoplastic polyimide resins; and
   b. a molding step of subjecting the blended metal particles and the substrate first to a pressure sufficient to render the metal particles conductive and then raising the blend to a temperature at said pressure above the flow temperature of the substrate.

2. The method of claim 1 wherein the substrate material is sufficiently fine that at least 50% will pass through a 4 mm sieve.

3. The method of claim 2 wherein the substrate material is sufficiently fine that at least 50% will pass through a 1 mm sieve.

4. The method of claim 1 wherein said blend is raised to a temperature in the range of 200°-400° C.

5. The method of claim 4 wherein said blend is raised to a temperature in the range of 240°-280° C.

6. The method of claim 1 wherein said blend is raised to a temperature below the melting point of any substantially present metal.

* * * * *